(12) United States Patent
Chung et al.

(10) Patent No.: US 7,903,420 B2
(45) Date of Patent: Mar. 8, 2011

(54) FIXING STRUCTURE OF FIXING A THERMAL MODULE

(75) Inventors: Chao-Tsai Chung, Taipei (TW); Kuo-Jung Hsu, Taipei (TW)

(73) Assignee: Asustek Computer Inc., Peitou, Taipei (TW)

( * ) Notice: Subject to any disclaimer, the term of this patent is extended or adjusted under 35 U.S.C. 154(b) by 29 days.

(21) Appl. No.: 12/056,935

(22) Filed: Mar. 27, 2008

(65) Prior Publication Data
US 2009/0009971 A1 Jan. 8, 2009

(30) Foreign Application Priority Data
Jul. 6, 2007 (TW) ................ 96124812 A

(51) Int. Cl.
*H05K 7/20* (2006.01)
*F28F 7/00* (2006.01)
*H01L 23/34* (2006.01)
*H01L 23/26* (2006.01)

(52) U.S. Cl. ......... 361/719; 361/704; 361/709; 361/700; 361/679.52; 165/80.4; 165/80.5; 165/185; 165/104.33; 257/718; 257/719; 174/16.3; 24/458; 24/459; 24/520

(58) Field of Classification Search ................. 361/700, 361/704, 709, 718–719; 165/80.1–80.2, 165/185; 257/78–719; 174/16.3; 24/458, 24/459, 520
See application file for complete search history.

(56) References Cited

U.S. PATENT DOCUMENTS

| 6,331,937 | B1 | 12/2001 | Bartyzel | |
|---|---|---|---|---|
| 6,646,881 | B1 * | 11/2003 | Lai et al. ........................ | 361/719 |
| 2004/0001316 | A1 * | 1/2004 | Kamikawa et al. ............ | 361/700 |
| 2006/0007659 | A1 * | 1/2006 | Lee et al. ........................ | 361/704 |
| 2007/0091576 | A1 * | 4/2007 | Wung et al. .................... | 361/719 |

FOREIGN PATENT DOCUMENTS

| CN | 1397998 | 2/2003 |
|---|---|---|
| TW | 584218 | 4/2004 |
| TW | M261007 | 4/2005 |

OTHER PUBLICATIONS

English language translation of abstract of CN 1397998.
English language translation of abstract of CN 1397998, Mar. 21, 2008.
English language translation of abstract of TW 584218 (published Apr. 11, 2004).
English language translation of abstract of TW M261007 (published Apr. 1, 2005).

* cited by examiner

*Primary Examiner* — Zachary M Pape
(74) *Attorney, Agent, or Firm* — Thomas, Kayden, Horstemeyer & Risley, LLP

(57) ABSTRACT

A fixing structure for fixing a thermal module on a chip of a printed circuit board is provided. The printed circuit board has a plurality of studs and a positioning post. The fixing structure includes a fixing board. The fixing board has a plurality of elastic strips, a plurality of screw holes and a spacing hole. The screw holes are on the elastic strips respectively, and the spacing hole is located close to one of the screw holes. The fixing board is positioned in the studs and the positioning post via the screw holes and the spacing hole, so that the fixing board can be fixed on the thermal module and chip.

7 Claims, 3 Drawing Sheets

FIXING STRUCTURE OF FIXING A THERMAL MODULE

RELATED APPLICATIONS

This application claims priority to Taiwan Application Serial Number 96124812, filed Jul. 6, 2007, which is herein incorporated by reference.

BACKGROUND OF THE INVENTION

1. Field of the Invention

The invention relates to a fixing structure and, more particularly, to a fixing structure for fixing a thermal Module

2. Description of the Related Art

In order to make a computer can process large data faster, the computer manufacturers must try to increase the processing speed of the chips in the computer. However, with the increase of the processing speed of the chips, more heat is generated during operation, so that a good thermal solution is demanded for cooling chips.

Most conventional thermal modules contact the chips directly and the heat generated by the chip can be conducted to the thermal module. However, once the contact between the thermal module and the chip is not preferred, the heat conduction efficiency is reduced so that the heat generated from the chip can not be dissipated successfully by the thermal module.

BRIEF SUMMARY OF THE INVENTION

An objective of the invention is providing a fixing structure to fix the position of a thermal module, so that the thermal module can be in contact with a chip on a printed circuit board (PCB).

According to one embodiment of the invention, a fixing structure is provided to fix a thermal module on a chip of a PCB. The PCB has a plurality of studs and a positioning post. The fixing structure includes a fixing board. The fixing board has a plurality of elastic strips, a plurality of screw holes, and a spacing hole. The screw holes are disposed in the elastic strips respectively, and the spacing hole is located close to one of the screw holes. In addition, the positioning post has two portions, wherein the two portions are a first portion and a second portion. The diameter of the first portion of the positioning post is greater than the diameter of the spacing hole, and the diameter of the second portion of the positioning post is less than the diameter of the spacing hole. The fixing board is positioned at the studs and the positioning post via screw holes and spacing holes respectively, so that the fixing board is fixed on the thermal module and the chip.

From above, in the embodiment of the invention, not only the position of the thermal module can be fixed, but also the position of the fixing board can be restricted by the lower edge of the nut of a screw for avoiding the chip receiving too much stress after the screw is fixed at the positioning post.

BRIEF DESCRIPTION OF THE DRAWINGS

These and other features, aspects, and advantages of the present invention will become better understood with regard to the following description, appended claims, and accompanying drawings.

DETAILED DESCRIPTION OF THE EMBODIMENTS

Figure 1:
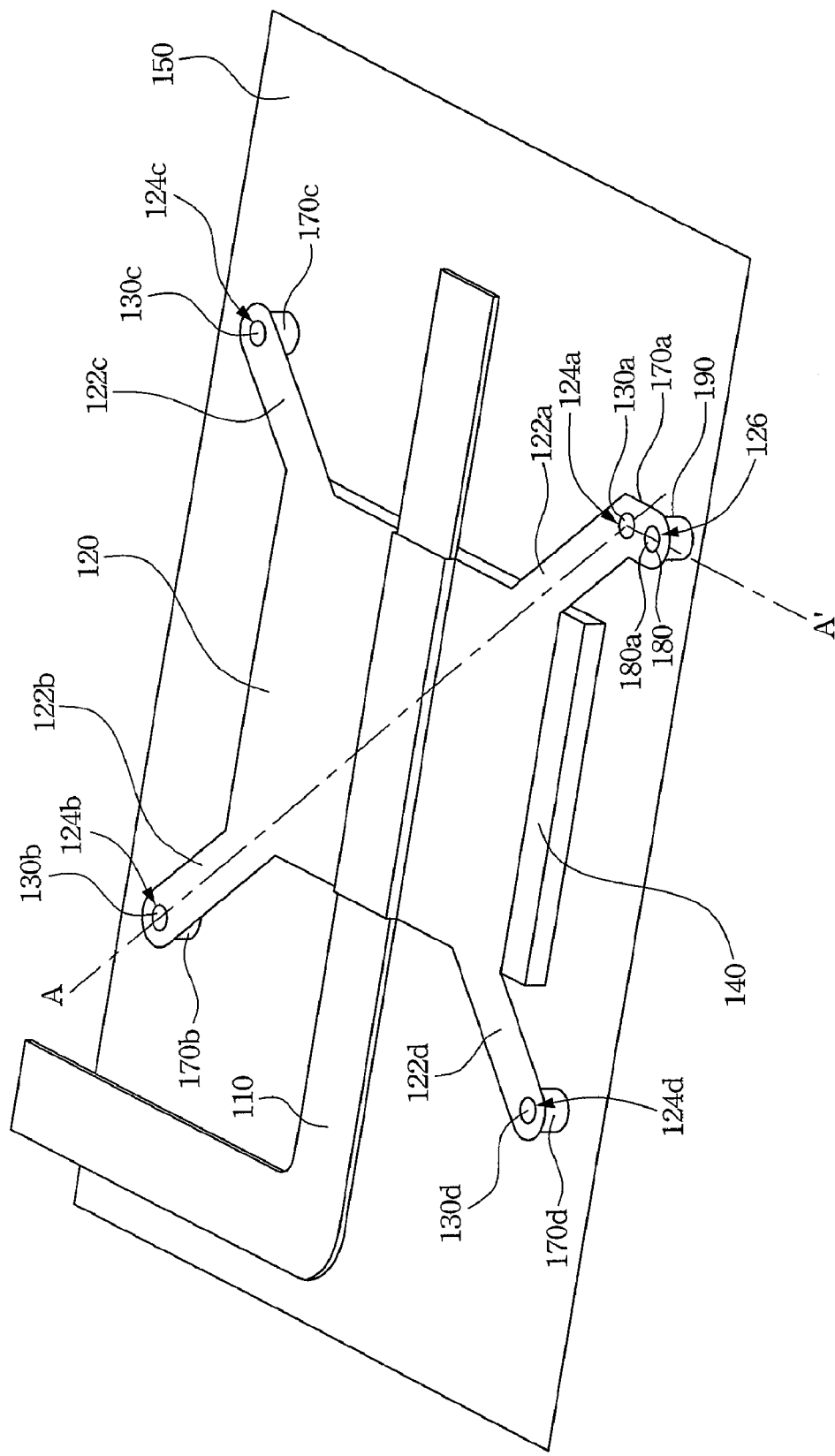
FIG. 1 is a three-dimensional schematic diagram showing a fixing structure according to an embodiment of the invention.
Figure 2:
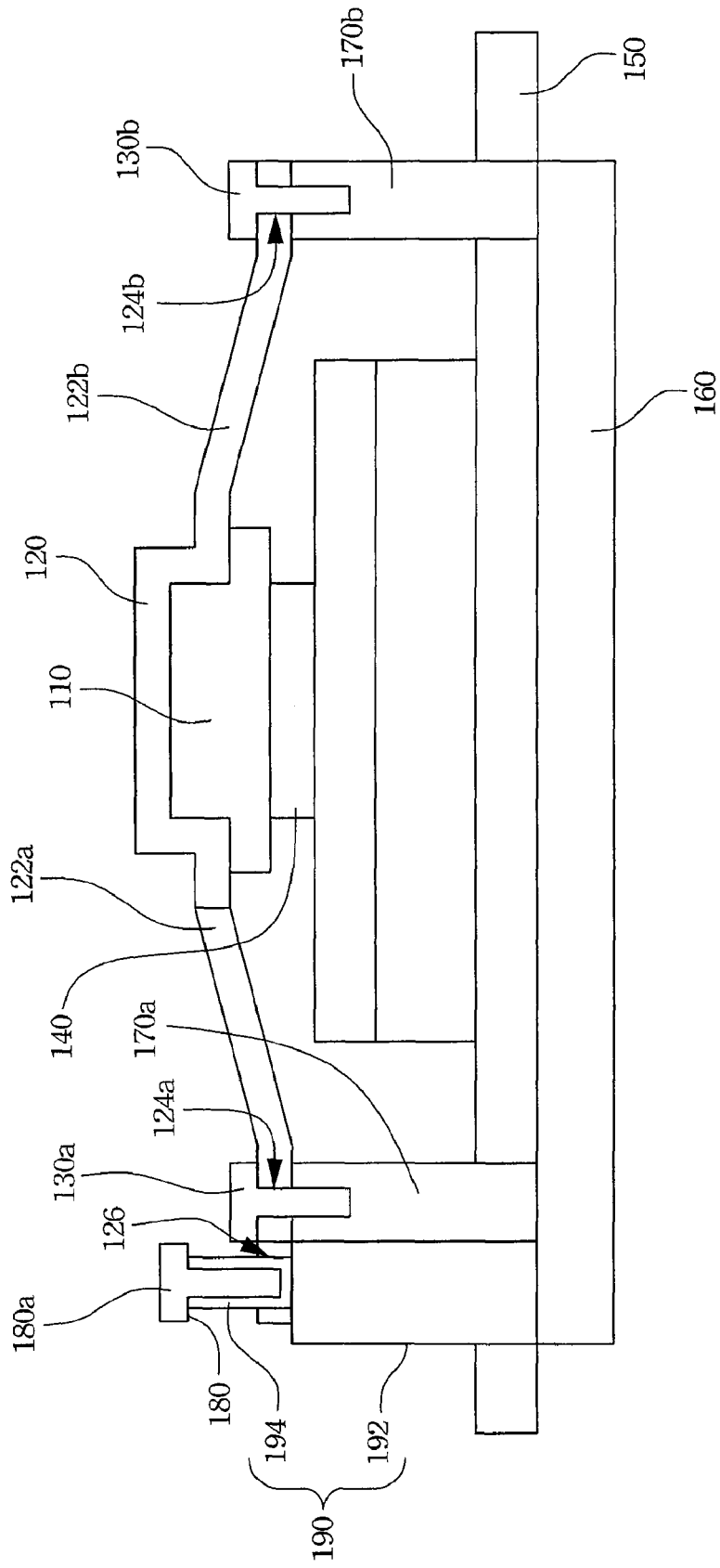
FIG. 2 is a section diagram along line A-A' shown in FIG. 1.

Please refer to FIG. 1 and FIG. 2. FIG. 1 is a three-dimensional schematic diagram showing a fixing structure according to an embodiment of the invention, and FIG. 2 is a section diagram along line A-A' shown in FIG. 1. The embodiment provides a fixing structure to fix a thermal module 110 on a chip 140 of a printed circuit board (PCB) 150. A plurality of studs 170a, 170b, 170c, and 170d and a positioning post 190 are assembled on the PCB 150. The fixing structure includes a fixing board 120, wherein the fixing board 120 has a plurality of elastic strips 122a, 122b, 122c, and 122d, a plurality of screw holes 124a, 124b, 124c, and 124d, and a spacing hole 126. The screw holes 124a, 124b, 124c, and 124d are disposed in the elastic strips 122a, 122b, 122c, and 122d respectively, and the spacing hole 126 is located close to the screw hole 124a. In addition, the fixing board 120 is positioned at the studs 170a, 170b, 170c, 170d and the positioning post 190 via the screw holes 124a, 124b, 124c, 124d and the spacing hole 126 respectively, so that the fixing board 120 can be fixed on the thermal module 110 and the chip 140.

In FIG. 1, the fixing board 120 is fixed on the thermal module 110 and the chip 140 by screws 130a, 130b, 130c, and 130d. In detail, the screws 130a, 130b, 130c, and 130d pass through the screw holes 124a, 124b, 124c, and 124d, respectively, to fasten the elastic strips 122a, 122b, 122c, and 122d on the studs 170a, 170b, 170c, and 170d. Furthermore, the fixing structure further includes a positioning screw 180a which can be pre-screwed in the positioning post 190. Therefore, when the screw 130b is assembled, the lower edge of the nut 180 of the positioning screw 180a restricts the position of the fixing board 120 to avoid damaging the solder ball of the chip 140 when the fixing board 120 moves.

In detail, the fixing structure shown in FIG. 1 can be assembled following these steps: (1) fixing the positioning screw 180a in the positioning post 190; (2) fixing the screw 130b in the stud 170b; (3) fixing the screw 130a on the stud 170a; (4) fixing the screws 130c and 130d on the studs 170c and 170d respectively. Therefore, when the screw 130b is fixed, the lower edge of the nut 180 of the positioning screw 180a can restrict the elastic strip 122a, so that the elastic strip 122a will not curve. Consequently, when the screw 130a is fixed in turn, the chip 140 will not be damaged by receiving too much stress. In addition, the positioning screw 180a can restrict the position of the thermal module 110 and then the thermal module 110 will not rotate clockwise in assembling, so that the stress on the chip 140 is reduced and the deformation of the PCB 150 also slows down.

As shown in FIG. 2, the fixing structure of the embodiment also can include a back plate 160 and the studs 170a, 170b, 170c, and 170d and the positioning post 190 are formed by extending from the back plate 160. Although the back plate 160 in FIG. 2 is an entity, but this does not limit the invention. When the PCB is provided next to the housing of the computer, the housing can be regarded as back plate without disposing extra back plate for the PCB.

In FIG. 2, the height of the positioning post 190 is higher than the studs 170a and 170b. Specifically, the positioning post 190 of in the FIG. 2 has two portions, wherein the two portions are a first portion and a second portion. The diameter of the first portion of the positioning post 192 is greater than the diameter of the spacing hole 126, and the diameter of the second portion of the positioning post 194 is less than the diameter of the spacing hole 126. That means the spacing hole 126 is provided through and positioned in the second portion of the positioning post 194, so that users can restrict the elastic strip 122a between the first portion of the positioning post 192 and the lower edge of the nut 180 of the positioning screw 180a only by taking an ordinary screw as the positioning screw 180a. The height of the first portion of the positioning post 192 can be equal to the height of the chip 140, so that when the spacing hole 126 passes through the positioning post 190 and is positioned, a positioning surface of the positioning post 190 is equal to a surface of the chip 140 in height for avoiding pressure on the chip 140 in fixing process.

Although the fixing structure in FIG. 1 uses elastic strips 122a, 122b, 122c, and 122d made of flexible material for providing elasticity to force the thermal module 110 and the chip 140 connect tightly, but it does not limit the invention. For example, the screws 130a, 130b, 130c, and 130d in FIG. 1 can be replaced by spring screws (as shown in FIG. 3) to provide elasticity to force the thermal module 110 and the chip 140 connect tightly.

Figure 3:
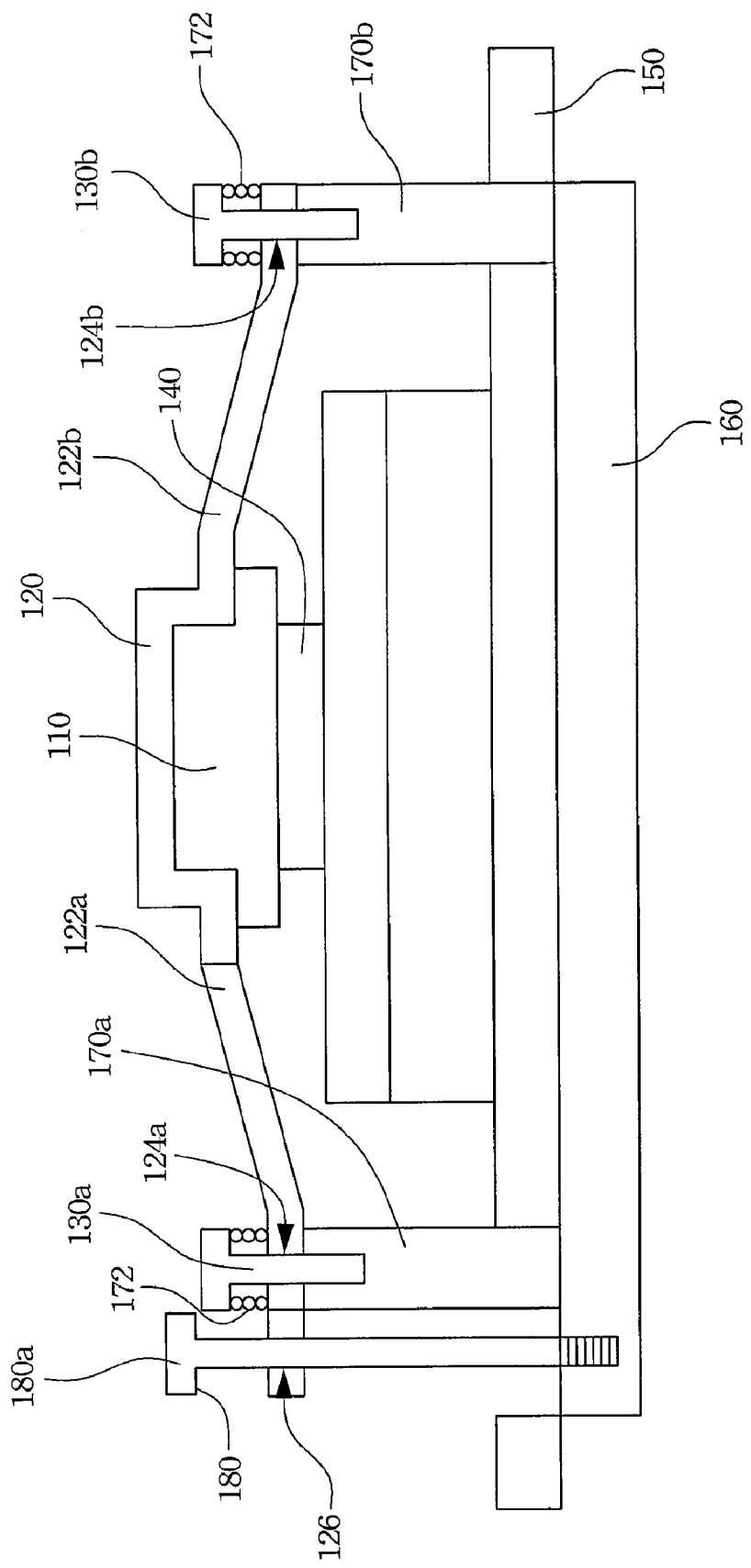
FIG. 3 is a section diagram showing a fixing structure according to another embodiment of the invention.

In detail, the studs 170a and 170b in FIG. 3 can have springs 172, and the two ends of the springs 172 are against the lower edge of the nut of the screws 130a, 130b and the elastic strips 122a, 122b respectively. When the screws 130a and 130b are fixed, the springs 172 are deformed by receiving a pressure and press the elastic strips 122a and 122b of the fixing board 120 to make the thermal module 110 and the chip 140 connect tightly. In addition, in another embodiment of the invention, the springs 172 can be replaced by any elastic rings made of flexible material.

Furthermore, another difference between FIG. 3 and FIG. 2 is that the positioning screw 180a in FIG. 3 is fixed on the back plate 160 without positioning post.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A fixing structure for fixing a thermal module on a chip of a printed circuit board (PCB), wherein a plurality of studs and a positioning post are extending from a back plate and assembled on the printed circuit board to receive screws respectively, and the fixing structure comprises:
   a fixing board having a plurality of elastic strips, a plurality of screw holes, and a spacing hole, wherein the screw holes are disposed in the elastic strips respectively, and the spacing hole is disposed in one of the elastic strips and close to the screw hole thereon;
   wherein the positioning post has two portions, the two portions are a first portion and a second portion, the diameter of the first portion of the positioning post is greater than the diameter of the spacing hole, and the diameter of the second portion of the positioning post is less than the diameter of the spacing hole;
   wherein when the fixing board is positioned on the studs and positioning post via the screw holes and the spacing hole, the screws pass through the screw holes and the spacing hole to fix the fixing board on the thermal module and the chip.

2. The fixing structure according to claim 1, wherein the fixing board is fixed on the thermal module and the chip by screws.

3. The fixing structure according to claim 1, wherein the elastic strips are made of flexible material.

4. The fixing structure according to claim 1, wherein at least one of the studs comprises a spring.

5. The fixing structure according to claim 1, wherein at least one of the studs comprises an elastic ring.

6. The fixing structure according to claim 1, wherein the height of the positioning post is higher than the height of the studs.

7. The fixing structure according to claim 1, wherein the second portion of the positioning post passes through the spacing hole.

* * * * *